United States Patent
Rothacher et al.

[19]

[11] Patent Number: 5,880,980
[45] Date of Patent: Mar. 9, 1999

[54] DISTRIBUTED DECIMATION SAMPLE RATE CONVERSION

[75] Inventors: Fritz M. Rothacher, Newport Beach; Daryush Shamlou, Laguna Niguel, both of Calif.

[73] Assignee: Rockwell International Corporation, Newport Beach, Calif.

[21] Appl. No.: 724,168

[22] Filed: Sep. 30, 1996

[51] Int. Cl.$^6$ .............................. G06F 17/17; G06F 7/38
[52] U.S. Cl. ....................... 364/724.1; 364/723
[58] Field of Search ................... 364/723, 724.1; 341/143, 155, 157

[56] References Cited

U.S. PATENT DOCUMENTS

| | | | |
|---|---|---|---|
| 4,020,332 | 4/1977 | Crochiere | 364/723 |
| 5,157,395 | 10/1992 | Del Signore et al. | 341/143 |
| 5,389,923 | 2/1995 | Iwata et al. | 341/61 |
| 5,471,411 | 11/1995 | Adams et al. | 364/724.01 |
| 5,475,628 | 12/1995 | Adams et al. | 364/724.1 |
| 5,489,903 | 2/1996 | Wilson et al. | 341/144 |
| 5,610,942 | 3/1997 | Chen et al. | 375/242 |
| 5,621,675 | 4/1997 | Linz et al. | 341/143 |
| 5,627,536 | 5/1997 | Ramirez | 341/141 |

*Primary Examiner*—Chuong Dinh Ngo
*Attorney, Agent, or Firm*—William C. Cray; Philip K. Yu

[57] ABSTRACT

A system for decimating a source signal with a source sample rate by a non-integer factor to a sink signal with a sink sample rate is disclosed. The system first determines a decimation factor based on a ratio of the source sample rate to the sink sample rate. The system then decimates the source signal by the decimation factor to an intermediate ("IM") signal with an IM sample rate which is larger than the sink sample rate. The IM signal is then applied to a sample-rate converter to down convert to the sink signal with the sink sample rate, using a decimation factor between only 1 and 2.

10 Claims, 2 Drawing Sheets

5,880,980

DISTRIBUTED DECIMATION SAMPLE RATE CONVERSION

FIELD OF THE INVENTION

The present invention is related to electronics circuits for converting data samples from one sample rate into data samples at another sample rate. More particularly, the invention is related to sample rate converters for high quality audio signal processing and conversion.

ART BACKGROUND

With the progress in digital processing and communication technology, it is becoming quite common to digitize signals produced by analog sources for further processing in the digital domain, for storage in digital form, or for transmission through digital media. However, in the digital domain, there are different sampling rates used depending on the required quality and the available bandwidth. Thus, it has become important to have simple digital interfacing between different equipment and media.

The concept of sample rate conversion ("SRC") is well known to those who work with digital signals for multimedia applications. A conventional approach to the application of SRC is to first digitize some analog signals at a constant sample rate using an analog-to-digital converter ("ADC"). The digital signals are then applied to the SRC so that the converted signals will have a sample rate suitable for the intended purposes and applications. The SRC may have the following applications, as an example:

In order to transmit high-quality ("HQ") audio signals through a communications channel, e.g. phone line, with bandwidth 4 kHz, it is required to down-convert the source signals' sample rate to 8 kHz for the transmission, since the HQ signals have typically been sampled at a sample rate of 44.1 kHz or 48 kHz.

Also, to digitally mix signals from CD-ROM with speech annotation, it is necessary to convert their sample rates to the same sample rate for the mixing, since the CD-ROM has a sample rate of 44.1 kHz, while speech typically has a sample rate of 8 kHz. While it is possible to convert both signals into analog for mixing in the analog domain, it has been quite expensive in the analog domain due to the need for DAC and ADC, not to mention the attendant distortion problems.

Further, to digitally store the digitized speech signals on a PC for later processing, SRC is also needed, due to the difference in sample rates.

FIG. 1 illustrates a conventional SRC for HQ audio signals. Such a system may include a mixer or microphone 110 for receiving analog source signals 100 such as music or speech, the received signals are then converted into an oversampled digital form by a sigma-delta analog/digital converter (ADC) 120. The digital signals are then applied a decimation filter 130 for converting its sample rate to, e.g. 44.1 kHz, before they are applied to the SRC 140 to down convert its sample rate to a range between 4 and 44.1 kHz. The resulting signals 145 can then be transmitted through a telephone link 150, stored in a permanent memory, or storage disk 155 or mixed with other source signals 160.

But the conventional system is quite costly both in memory and computation cycle requirements in order to be able to convert from 44.1 down to 4 or 8 kHz, since this is a down conversion factor of more than 11 and 5, respectively. Since the required resources for the SRC both in memory and computations are proportional to the down sample ratio of the SRC, it is thus desirable to have a much more efficient implementation than the conventional approach.

SUMMARY OF THE INVENTION

Therefore, it is an object of the present invention to efficiently perform decimation sample rate conversion for high quality audio signals.

It is also an object of the present invention to perform decimation sample rate conversion with reduced computation cycles and RAM requirements.

A system for decimating a source signal with a source sample rate by a non-integer ratio to a sink signal with a sink sample rate is disclosed. The system first determines a decimation factor based on the ratio of the source sample rate to the sink sample rate. The system then decimates the source signal by the decimation factor to an intermediate ("IM") signal with an IM sample rate which is larger than the sink sample rate. The IM signal is then applied to a sample-rate converter to down convert to the sink signal with the sink sample rate, using a factor between only 1 and 2.

DETAILED DESCRIPTION OF THE PREFERRED EMBODIMENTS

A method and system for distributed decimation sample rate conversion is disclosed. This embodiment has been developed for implementation as an integrated circuit for use with digital audio equipment. It should be understood by those skilled in the art that modifications may be made to optimize the sample rate converter for different applications and systems. The degrees of accuracy for the integrator, differentiator, FIR halfband filters are factors among others which can be optimized for a given application.

Figure 1:
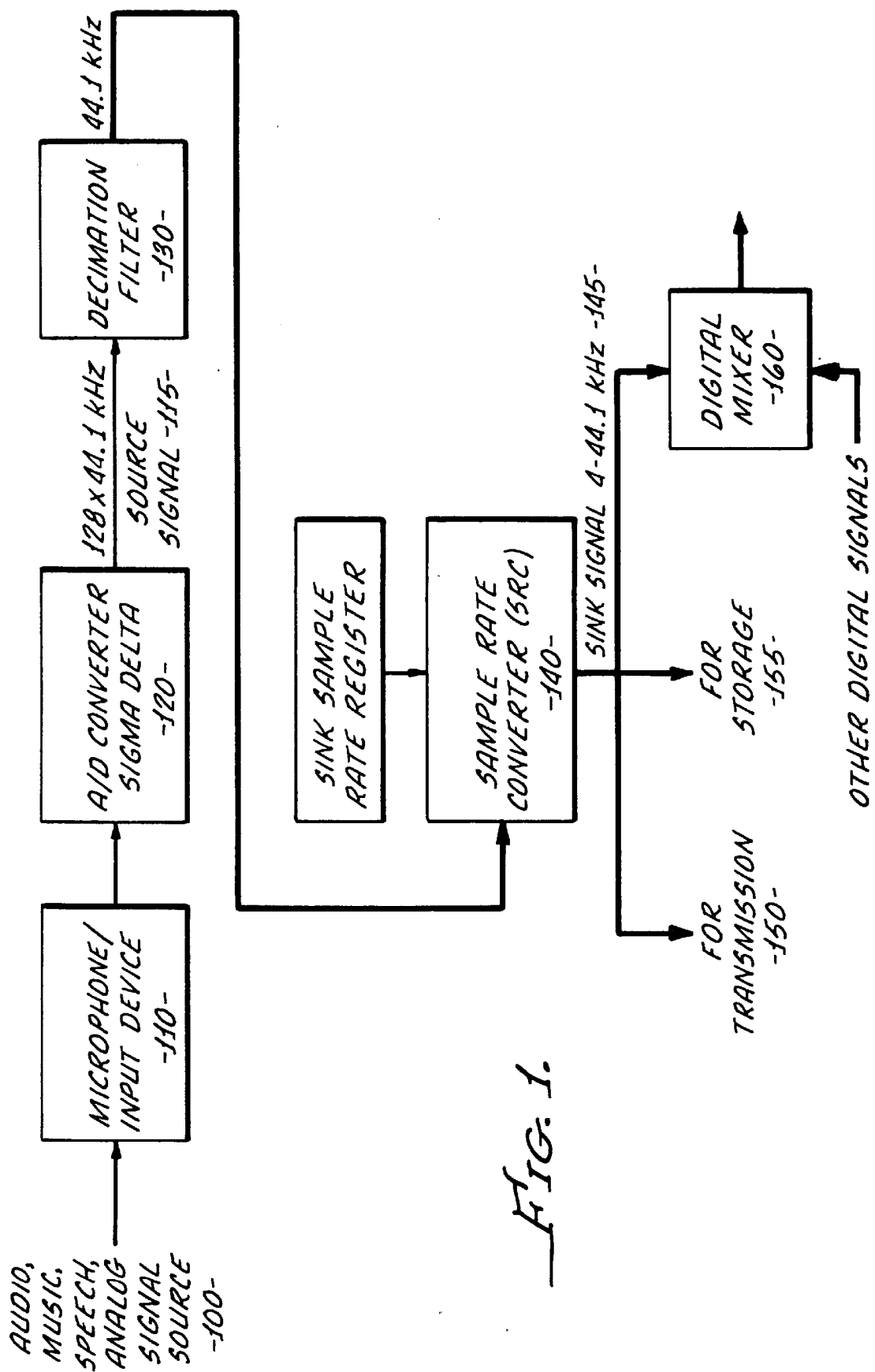
FIG. 1 is a simplified block diagram of a conventional high-quality sample rate conversion system.
Figure 2:
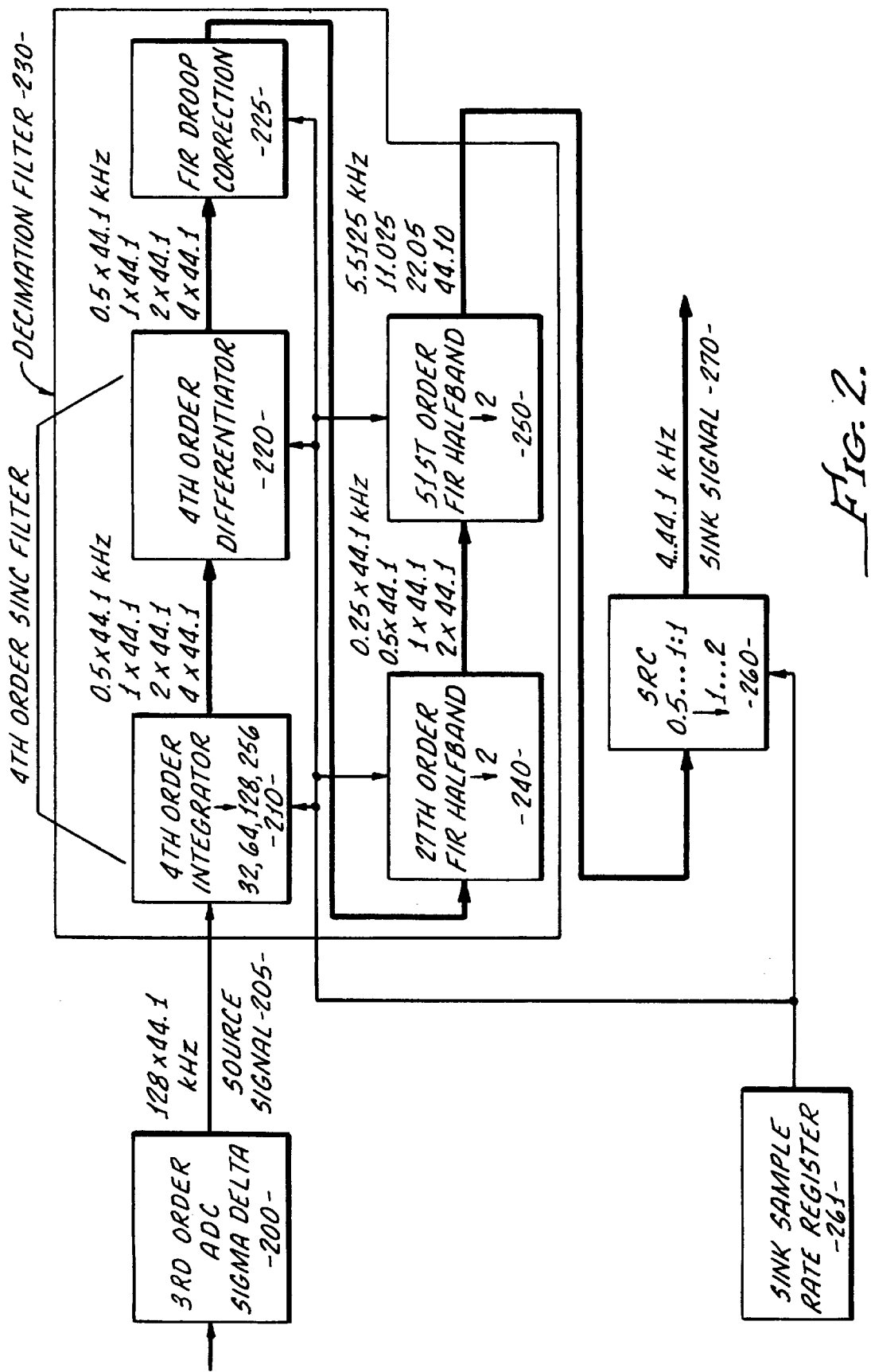
FIG. 2 is a simplified block diagram of the distributed sample rate conversion system in accordance with the present invention.

Reference is to FIG. 2, where a simplified block diagram of the distributed decimation sample rate conversion in accordance with the present invention is shown. The individual functional blocks will be described as follows. The analog/digital converter 200 (ADC) is a third-order sigma delta converter for converting an analog input signal into an oversampled bit stream. Currently, the signals are oversampled at 128×44.1 kHz (=5.6448 MHz).

After the ADC 200, the source signals are applied to the decimation filter 230 for noise filtering and decimation. The decimation filter block 230 has the following components: 4th-order integrator 210, 4th-order differentiator 220, finite impulse response (FIR) droop correction unit 225, 27th-order FIR halfband filter 240, 51st-order FIR halfband filter 250.

The integrator 210 and the differentiator 220, which together constitute a 4th-order SINC filter, decimate the oversampled source signals from its sample rate of 128×44.1 kHz down to 0.5×44.1 kHz, 1×44.1 kHz, 2×44.1 kHz and 4×44.1 kHz, with a decimation factor of 256, 128, 64 and 32, respectively. The selection of the decimation factor is based on information transmitted from a programmable register 261, which stores the sink sample rate information. As will be described, the decimation factor is chosen such that the resulting sample rate after the decimation filter 230 is in the range between 1- and 2-times the sink sample rate.

After the integrator 210 and the differentiator 220, the signals are applied to an FIR droop correction unit 225. The droop correction is to correct the attenuation of high frequencies introduced by the integrator 210 and the differentiator 220.

The signals after the droop correction unit 225 are applied to two (2) FIR halfband filters 240, 250, which will decimate the signals by a factor 2 in each. Currently, the first halfband filter 240 is of the 27th-order and the second halfband filter 250 is of the 51st-order.

The intermediate ("IM") signals after the second halfband filter 250 can have a sample rate at any of 5.5125 kHz, 11.025 kHz, 22.05 kHz and 44.10 kHz, depending on the decimator factor used by the integrator 210. Note that these sample rates are still a power-of-2 fraction of the source sample rate of 128×44.1 kHz, i.e. $2^{-10}$, $2^{-9}$, $2^{-8}$ and $2^{-7}$ of 128×44.1 kHz, respectively.

To prepare the IM signal for digital mixing or transmission in multimedia applications, it will be necessary to be able to convert the sample rate to a range between 4 kHz and 44.1 kHz, using a sample-rate converter ("SRC") 260.

A programmable register 261 stores the sink sample rate. The register sends out control information to the 4th order SINC filter, droop correction unit 225, the FIR halfband filters 240, 250 and the SRC 260, to indicate the range for the decimation by each unit.

With the distributed decimation described above, the SRC 260 only needs to perform a down conversion by a factor between 1 or 2, thereby conserving resources. The sink sample rate thereafter can be anywhere from 4 to 44.1 kHz, depending on the application and whether the sink samples are transmitted, stored, or mixed.

To illustrate the benefits and advantages of the present invention, Table 1 lists the effect of this distributed decimation sample rate conversion on the SRC factors, which can now be limited to a range between 1 and 2. Note that the required resources are proportional to the largest down sample factor. For example, at row (1), if the desired sink sample rate is 4 kHz, then the decimation factor of the SINC filter is set to be 256 to first decimate the source sample rate down to 0.5×44.1 kHz (=22.05 kHz).

After the factor 4 decimation by the halfband filters 240, 250, the SRC 260 only needs to down convert from 5.125 kHz to 4 kHz, using an SRC factor of only 1.28125. In the conventional methodology described above, the SRC will always have to down convert from 44.10 kHz after the FIR halfband (130) to 4 kHz—a conversion factor of more than 11! The decimation was not distributed to offload the burden on the SRC.

Therefore, in accordance with the present invention, the system first considers the sink sample rate before the decimation factor of the SINC filter is set. Based on the range of the sink sample rate, the system chooses the decimation ratio accordingly.

The cost savings can be realized in the requirements of the random-access memory ("RAM"), which stores the data samples for the SRC. The distributed decimation can realize savings even with the requisite increase in a slightly larger integrator, since the size of the integrator 210 is proportional to $\log_2$ of the SINC decimation factor, whereas the size of the SRC RAM is proportional to the SRC decimation factor.

Although only a few exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention as defined in the following claims. In the claims, means-plus-function clauses are intended to cover the structures described herein as performing the recited function and not only structural equivalents but also equivalent structures. Thus although a nail and a screw may not be structural equivalents in that a nail employs a cylindrical surface to secure wooden parts together, whereas a screw employs a helical surface, in the environment of fastening wooden parts, a nail and a screw may be equivalent structures.

We claim:

1. A method of decimating a source signal with a source sample rate by a non-integer ratio to a sink signal with a sink sample rate, comprising the steps of:

a) determining a largest power-of-2 decimation factor based on the source sample rate and the sink sample rate;

b) decimating the source signal by the decimation factor to an intermediate signal with an intermediate ("IM") sample rate which is as least as large as the sink sample rate;

c) applying sample-rate conversion to the IM signal to down convert to the sink signal with the sink sample rate.

2. A method according to claim 1, wherein the IM signal has a sample rate between about 1× and about 2× of the sink sample rate.

3. A method according to claim 2, wherein the step c) applies the sample rate conversion with a down-conversion factor between 1 and 2, inclusive.

TABLE 1

| | Source Sample Rate [kHz] | SINC Deci. Factor | SINC Output Rate [kHz] | Halfband 1 Output Rate [kHz] | Halfband 2 Output Rate [kHz] | Sink Sample Rate Range [kHz] | SRC Factor | Prior SRC Factor |
|---|---|---|---|---|---|---|---|---|
| 1 | 128 × 44.1 | 256 (32)* | 0.5 × 44.1 | 0.25 × 44.1 | 5.5125 (44.1)* | b/w 4 and 5.5125 | 1 . . . 2 | 8 . . . 12 |
| 2 | 128 × 44.1 | 128 (32)* | 1 × 44.1 | 0.5 × 44.1 | 11.025 (44.1)* | b/w 5.5125 and 11.025 | 1 . . . 2 | 4 . . . 8 |
| 3 | 128 × 44.1 | 64 (32)* | 2 × 44.1 | 1 × 44.1 | 22.05 (44.1)* | b/w 11.025 and 22.05 | 1 . . . 2 | 2 . . . 4 |
| 4 | 128 × 44.1 | 32 (32)* | 4 × 44.1 | 2 × 44.1 | 44.10 (44.1)* | b/w 22.05 and 44.10 | 1 . . . 2 | 1 . . . 2 |

*( . . . ) indicates the values from a system without distributed decimation.

4. A method of decimating a source signal with a source sample rate to a sink signal with a sink sample rate, comprising the steps of:

a) determining ratio of the source sample rate to the sink sample rate;

b) determining a power-of-2 decimation factor based on the ratio;

c) decimating the source signal by the decimation factor to an IM signal with an IM sample rate, where the IM sample rate is larger than the sink sample rate;

d) converting the IM signal by a non-integer factor to the sink signal with the sink sample rate by using a sample rate converter.

5. The method according to claim 4, wherein the IM sample rate is between about 1× and about 2× the sink sample rate.

6. The method according to claim 5, wherein the source signal is an oversampled signal of an input signal.

7. A system for decimating a source signal with a source sample rate by a non-integer ratio to a sink signal with a sink sample rate, comprising:

means for determining a power-of-2 decimation factor based on a ratio of the source sample rate to the sink sample rate;

variable decimation filter means for decimating the source signal by the decimation factor to an intermediate signal ("IM") with an IM sample rate which is larger than, or equal to, the sink sample rate, the variable decimation filter means comprising a SINC filter;

sample-rate converter means for down-converting the IM signal by a non-integer factor to the sink signal with the sink sample rate.

8. The system according to claim 7, wherein the variable decimation filter means decimates the source signal to the IM signal with a sample rate between about 1× and about 2× of the sink sample rate, using a programmable decimator factor.

9. The system according to claim 8, wherein the sample-rate converter means converts using a conversion factor between 1 and 2.

10. The system according to claim 9, wherein the source signal is oversampled by an oversampling factor, wherein the variable decimation filter means comprises:

variable decimation integrator mean for integrating and decimating the source signal to generate an integration output, using one of the following decimation factors: 32, 64, 128, and 256 based on the oversampling factor and the sink sample rate;

differentiator means coupled to the integrator means for differentiating the integration output to generate a differentiator output;

FIR droop correction means coupled to the differentiator means for correcting high-frequency attenuation from the SINC filter to generate a corrected output;

first FIR halfband filter means coupled to the FIR droop correction means for down-converting the corrected output by a factor of 2;

second FIR halfband filter means coupled to the first FIR halfband filter means for generating the IM signal with the IM sample rate by a factor of 2.

\* \* \* \* \*